United States Patent
Nakata (10) Patent No.: US 9,865,720 B2
(45) Date of Patent: Jan. 9, 2018

(54) HIGH ELECTRON-MOBILITY TRANSISTOR

(71) Applicant: SUMITOMO ELECTRIC INDUSTRIES, LTD., Osaka (JP)

(72) Inventor: Ken Nakata, Fujisawa (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/241,924

(22) Filed: Aug. 19, 2016

(65) Prior Publication Data

US 2017/0054015 A1   Feb. 23, 2017

(30) Foreign Application Priority Data

Aug. 20, 2015 (JP) .................................. 2015-162602

(51) Int. Cl.

| | | |
|---|---|---|
| *H01L 29/778* | (2006.01) | |
| *H01L 29/66* | (2006.01) | |
| *H01L 29/08* | (2006.01) | |
| *H01L 29/20* | (2006.01) | |
| *H01L 29/205* | (2006.01) | |

(52) U.S. Cl.
CPC ...... *H01L 29/7786* (2013.01); *H01L 29/0843* (2013.01); *H01L 29/2003* (2013.01); *H01L 29/205* (2013.01)

(58) Field of Classification Search
CPC .......... H01L 29/2003; H01L 29/66462; H01L 29/7787; H01L 29/7786; H01L 29/1066; H01L 21/0254; H01L 29/205; H01L 29/4236; H01L 29/7783; H01L 21/02458; H01L 29/7789; H01L 33/32
See application file for complete search history.

(56) References Cited

U.S. PATENT DOCUMENTS

| | | | |
|---|---|---|---|
| 2006/0124962 A1* | 6/2006 | Ueda ................. | H01L 21/28581 257/192 |
| 2006/0180831 A1 | 8/2006 | Nakazawa et al. | |
| 2007/0194354 A1* | 8/2007 | Wu ..................... | H01L 29/7787 257/288 |
| 2013/0087803 A1* | 4/2013 | Kizilyalli .......... | H01L 29/66462 257/76 |
| 2015/0041860 A1 | 2/2015 | Nishimori et al. | |

FOREIGN PATENT DOCUMENTS

| | | |
|---|---|---|
| JP | 2006-261642 | 9/2006 |
| JP | 2015-037105 | 2/2015 |

* cited by examiner

*Primary Examiner* — Sonya D McCall Shepard
(74) *Attorney, Agent, or Firm* — Smith, Gambrell & Russell, LLP.

(57) ABSTRACT

A nitride semiconductor device is disclosed. The semiconductor device provides the GaN channel layer, the InAlN barrier layer on the GaN channel layer, and the n-type AlGaN layer on the InAlN barrier layer. The source and drain electrodes are formed on the n-type AlGaN layer, while, the gate electrode is formed directly on the InAlN barrier layer. The n-type AlGaN layer has the aluminum (Al) composition greater than 20% at the interface against the InAlN barrier layer, which is greater than the aluminum (Al) composition at the interface against the source electrode.

13 Claims, 5 Drawing Sheets

*Fig. 5 (Prior Art)* ated open No. JP2006-
HIGH ELECTRON-MOBILITY TRANSISTOR

BACKGROUND OF THE INVENTION

1. Field of the Invention

The present application relates to a high electron mobility transistor (HEMT), in particular, relates to a HEMT made of primarily nitride semiconductor materials.

2. Background Arts

Figure 4:
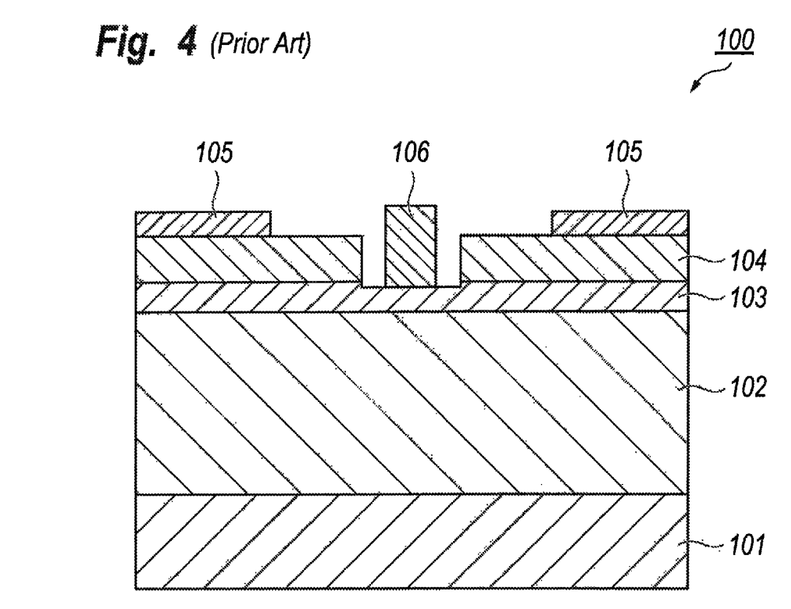
FIG. 4 schematically shows a cross section of a HEMT disclosed in the first prior document.

A Japanese Patent Application laid open No. JP2006-261642A has disclosed a field effect transistor (FET) and a process to form the FET. FIG. 4 schematically illustrates a cross section of the FET disclosed therein. The FET 100 provides an undoped GaN channel layer 102, an n-type AlGaN barrier layer 103, and an n-type InAlGaN contact layer 104 where these layers, 102 to 104, are sequentially grown on a substrate 101 made of sapphire ($Al_2O_3$). Provided on the n-type contact layer 104 are ohmic electrodes made of stacked metal of titanium (Ti) and aluminum (Al) for source and drain electrodes. A portion of the n-type contact layer 104 exposes the n-type barrier layer 103 on which another electrode 106, Schottky electrode, made of alloy containing palladium (Pd) and silicon (Si) is formed.

Figure 5:
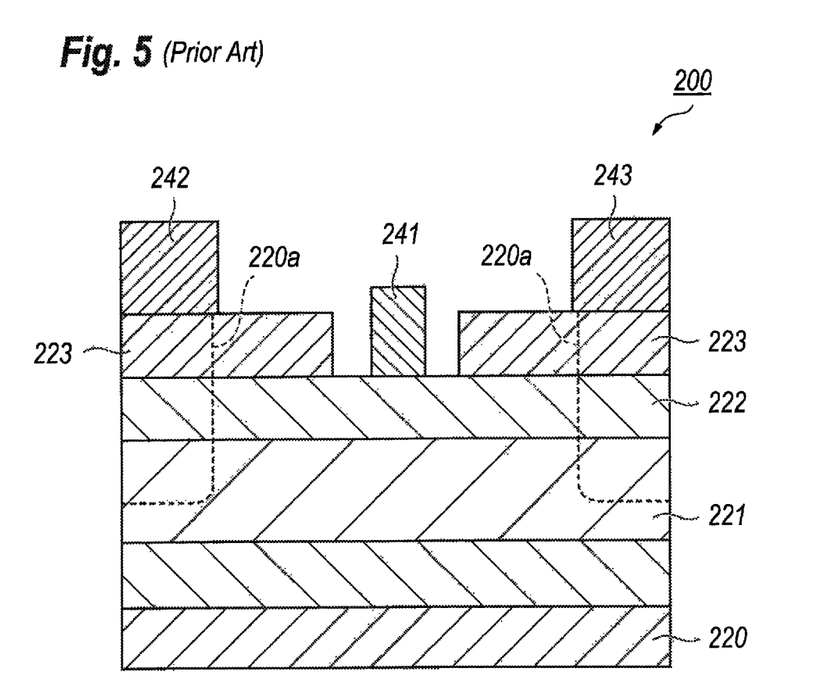
FIG. 5 schematically shows a cross section of another HEMT disclosed in the second prior document.

Another Japanese Patent Application laid open No. JP2015-037105A has disclosed a semiconductor device having InAlN layer. FIG. 5 schematically illustrates a cross section of a HEMT disclosed therein. The HEMT 200 includes GaN electron transporting layer 221 as the channel layer on a substrate 210, an InAlN electron supplying layer 222 as the barrier layer formed on the electron transporting layer 221, an AlGaN upper layer 223 formed on the electron supplying layer 222, a gate electrode 241 formed on the electron supplying layer 222 exposed within an opening of the AlGaN upper layer 223, and a source and a drain electrodes, 242 and 243, formed on the upper layer 223. The upper layer 223 and the electron supplying layer 222 in respective portions beneath the source and drain electrodes, 242 and 243, provide a region of the first conduction type implanted with impurities, for instance, silicon (Si).

Nitride semiconductor devices, because of wider bandgap energy thereof and accordingly greater breakdown voltages without decreasing a saturation electron velocity, have been widely investigated for applications of high power at high frequencies. In particular, a hetero-interface between GaN layer and AlGaN layer, or between GaN layer and InAlN layer, may induce enough electrons in the GaN layer in vicinity of the interface, which is often called as the two-dimensional electron gas (2DEG), and may be applicable to a high electron mobility transistor (HEMT).

High frequency performance of a transistor is determined by a cut-off frequency thereof. The cut-off frequency is the frequency at which the voltage gain of the transistor becomes the unity. In order to increase the cut-off frequency, the reduction of gate capacitance and the increase of the trans-conductance become key factors. The increase of the trans-conductance may be achieved by the reduction of the access resistance between the source electrode and the gate electrode. A thinner barrier layer and smaller contact resistance of the source electrode may be effective for the reduction of the access resistance.

An indium aluminum nitride (InAlN) is a most likely material for the barrier layer because even a thinner InAlN layer may induce greater electrons. Thus, the barrier layer made of InAlN may reduce the access resistance.

On the other hand, the reduction of the contact resistance has been left hard. In a HEMT primarily made of gallium arsenide (GaAs), a heavily doped contact layer, typically $n^+$-GaAs layer, on the barrier layer made of AlGaAs, may effectively reduce the contact resistance. However, a HEMT made of nitride semiconductor materials, in particular, when a heavily doped GaN layer is provided on the InAlN barrier layer, and the source electrode is in contact to this heavily doped GaN layer; the interface between the InAlN barrier layer and the $n^+$-GaN layer may also induce electrons, which raises the conduction band of the InAlN barrier layer and the InAlN barrier layer may operate as a barrier for the electron transport, which increases the access resistance.

An $n^+$-type InAlGaN layer may be replaced from the $n^+$-GaN layer as the first prior document. However, because InAlGaN contains indium (In), the $n^+$-InAlGaN is necessary to be grown at relatively low temperature, which accelerates the capture of carbons (C) during the growth. Because carbons operate as an acceptor in nitride semiconductor materials, the InAlGaN layer is hard to be heavily doped with n-type impurities.

An ion implantation of n-type impurities may decrease the access resistance of a HEMT as the second prior document has disclosed. However, ions implanted deeper than the interface between the barrier layer and the channel layer may become sources for leak currents between the drain and source electrodes, which degrades the pinch-off performance of the HEMT.

SUMMARY OF THE INVENTION

The invention relates to a nitride semiconductor device that comprises a channel layer, a barrier layer, and an n-type layer. The channel layer may be made of gallium nitride (GaN). The barrier layer, which is provided on the channel layer, may be made of indium aluminum nitride (InAlN). The n-type layer, which is provided on the barrier layer, may be made of aluminum gallium nitride (AlGaN) doped with n-type impurities. Features of the n-type layer of the embodiment is that an aluminum composition thereof is greater than 20% at an interface against the channel layer, and the aluminum composition of the n-type layer at the interface against the channel layer is greater than the aluminum composition at a surface opposite to the interface against the channel layer.

DESCRIPTION OF EMBODIMENT

Next, embodiment of the present invention will be described as referring to drawings. In the description of the drawings, numerals or symbols same with or similar to each other will refer to elements same with or similar to each to each other without duplicating explanations.

First Embodiment

Figure 1:
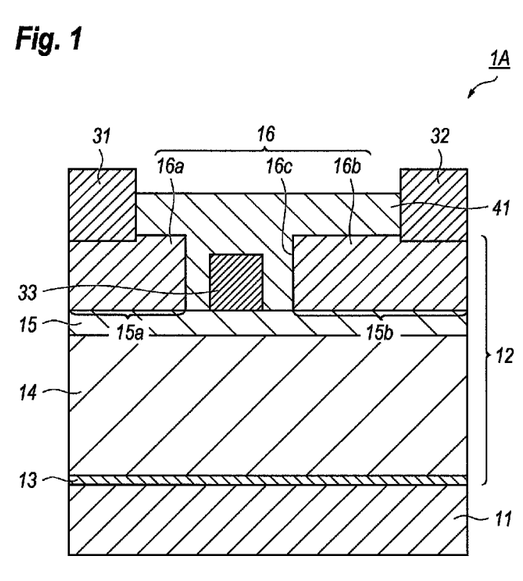
FIG. 1 schematically shows a cross section of a high electron-mobility transistor (HEMT) according to the first embodiment of the present application.

FIG. 1 schematically illustrates a cross section of a high electron-mobility transistor (HEMT) 1A according to the first embodiment of the present invention. The HEMT 1A includes a substrate 11, a semiconductor stack 12, a source electrode 31, a drain electrode 32, and a gate electrode 33. The semiconductor stack stacks a buffer layer 13, a channel layer 14 made of gallium nitride (GaN), a barrier layer 15 made of indium aluminum nitride (InAlN), and an n-type layer 16 made of aluminum gallium nitride (AlGaN) in this order on the substrate 11. Further, a surface protection layer 41 covers a whole surface of the HEMT 1A.

The substrate 11, which is provided for an epitaxial growth, may be made of silicon carbide (SiC), sapphire (Al$_2$O$_3$), and so on. The buffer layer 13, which is epitaxially grown on the substrate 11, may be made of nitride semiconductor material containing as a group 11 elements, typically, aluminum nitride (AlN) and aluminum gallium nitride (AlGaN). The buffer layer 13 may have a thickness of greater than 10 nm but thinner than 30 nm. The channel layer 14, which is made of gallium nitride (GaN) epitaxially grown on the buffer layer 13, may have a thickness of, for instance, thicker than 400 nm but thinner than 2000 nm.

The barrier layer 15, which is sometimes called as an electron supply layer, is epitaxially grown on the channel layer 14 and has a thickness of, for instance, thicker than 9 nm but thinner than 12 nm. The barrier layer 15 may induce a two-dimensional electron gas (2DEG) in an interface against the channel layer 14, exactly, in the channel layer 14 adjacent to the interface against the barrier layer 15. A region including the 2DEG in the channel layer may operate as a channel region of the HEMT 1A. The barrier layer 15 may have a composition of indium (In) preferably greater than 15% but less than 19%, which may be determined by a lattice matching condition with respect to the channel layer 14. The barrier layer 15 of the present invention has the indium (In) composition of 17%.

The n-type layer 16, which is a heavily doped n-type layer epitaxially grown on the barrier layer 15, includes a first region 16a and a second region 16b, where the first region 16a is provided on a first region 15a of the barrier layer 15, while the second region 16b is provided on a second region 15b of the barrier layer 15. An opening 16c, which may be formed by etching portions of the first region 16a and the second region 16b, exists between the first and second regions, 16a and 16b. The n-type layer 16 of the present embodiment may be made of AlGaN heavily doped with silicon (Si) as n-type impurities, has a thickness of 50 to 100 nm and a concentration of impurities of $1 \times 10^{18}$ to $5 \times 10^{18}$ cm$^{-3}$.

The n-type layer 16 of the present embodiment has aluminum (Al) composition greater than 20% in a region including the interface against the barrier layer 15, which is higher than an aluminum (Al) composition in another region including a top surface of the n-type layer 16 opposite to the former region. The another region, as will be described layer, is in contact to the source electrode 31. Thus, the aluminum (Al) composition is the highest at the interface against the barrier layer 15 and the lowest in the top surface in contact to the source electrode 31. One example of the aluminum composition is 30% at the interface against the barrier layer 15, while, it is 15% at the top surface thereof. The aluminum (Al) composition of the n-type layer 16 monotonically decreases from the interface against the barrier layer 15 to the top surface thereof; that is, the n-type AlGaN layer 16 has a graded aluminum (Al) composition from the interface to the top surface thereof.

The source, gate and drain electrodes, 31 to 33, are provided on the semiconductor stack 12 in this order; that is, the source and drain electrodes, 31 and 33, put the gate electrode 32 therebetween. The first region 16a of the n-type layer 16 provides the source electrode 31 thereon, while the second region 16b of the n-type layer 16 provides the drain electrode 33 thereon. The source and drain electrodes, 31 and 33, make non-rectifying contact against the respective regions, 16a and 16b, of the n-type layer 16. The source and drain electrodes, 31 and 33, may be provided on hollows of the respective regions, 16a and 16b, which are formed by slightly etching the top surfaces of the regions, 16a and 16b. The gate electrode 33 is in direct contact to the barrier layer 15, that is, in contact to a top surface of the barrier layer 15 exposed in a bottom of the opening 16c.

The protection layer 41, which fully overs the semiconductor stack 12 and the gate electrode 32, is an insulating film made of inorganic material such as silicon nitride (SiN), silicon oxide SiO$_2$, and/or silicon oxy-nitride (SiON).

Next, advantages of the HEMT 1A according to the present invention will be described. In a case where a HEMT is made of nitride semiconductor materials providing a heavily doped n$^+$-type GaN layer grown on a barrier layer made of InAlN in order to reduce the contact resistance of the source electrode 31 and the drain electrode 32, such a GaN layer induces carriers at an interface against the InAlN barrier layer due to the polarization in the InAlN barrier layer, which widens the band discontinuity between the n$^+$-GaN layer and the InAlN barrier layer and increases parasitic resistance between the source electrode and the channel. Namely, the interface between the InAlN barrier layer and the n$^+$-type GaN layer induces negative carriers, which raises the energy level of the InAlN barrier layer and operates as a barrier for the carrier transport from the source electrode to the channel. Although the contact resistance of the source electrode 31 decreases, the access resistance between the source electrode 31 to the gate electrode 32 increases.

The HEMT 1A of the present embodiment provides, substituted from the heavily doped n-type GaN layer, the n-type AlGaN layer on the InAlN barrier layer 15. Increasing the aluminum composition of the n-type AlGaN layer 16 enough high, which increases the lattice miss-matching between the n-type AlGaN layer 16 and the InAlN barrier layer 15 and induces positive carriers in the interface between the InAlN barrier layer 15 and the n-type AlGaN layer 16 due to the piezo effect. The positive carriers thus induced may compensate negative carriers induced by the polarization of the InAlN barrier layer 15 at the interface against the n-type AlGaN layer 16. Resultantly, net amounts of the negative carriers due to the polarization may be decreased.

In order to enhance the effect to prohibit the creation of the transport barrier in the hetero interface, the n-type AlGaN layer 16 preferably has the aluminum composition enough high in a region adjacent to the interface against the InAlN barrier layer 15. The aluminum composition thereat is preferably greater than 20%. Such AlGaN layer 16 may effectively compensate the positive carriers in the interface of the InAlN barrier layer with the indium composition of about 17%.

Thus, the HEMT 1A according to the present embodiment may suppress the influence of the positive carries induced in the interface of the InAlN barrier layer against the heavily doped n-type layer by the piezo electric effect, which effectively decreases the access resistance of the HEMT 1A, without increasing the contact resistance of the source 31.

When the aluminum composition in the n$^+$-type AlGaN layer 16 further increases, that is, the n$^+$-type AlGaN layer is replaced by an n$^+$-type AlN layer, the positive carries induced in the InAlN barrier layer 15 may further decrease. However, an AlN has the widest bandgap energy in nitride semiconductor materials and generally shows electrically insulating characteristics. Moreover, increasing the aluminum composition in n$^+$-type AlGaN layer 16, the lattice mismatching with respect to the InAlN barrier layer 15 becomes enormous, the n-type AlGaN layer is easily induced by cracks. Thinner AlGaN layer 16 with a larger aluminum composition may avoid cracks; however, such thinner AlGaN layer 16 may not contribute the reduction of the contact resistance of the source electrode 31. Thus, the n$^+$-type AlGaN layer 16 preferably has the aluminum composition smaller than 40%.

Figure 2:
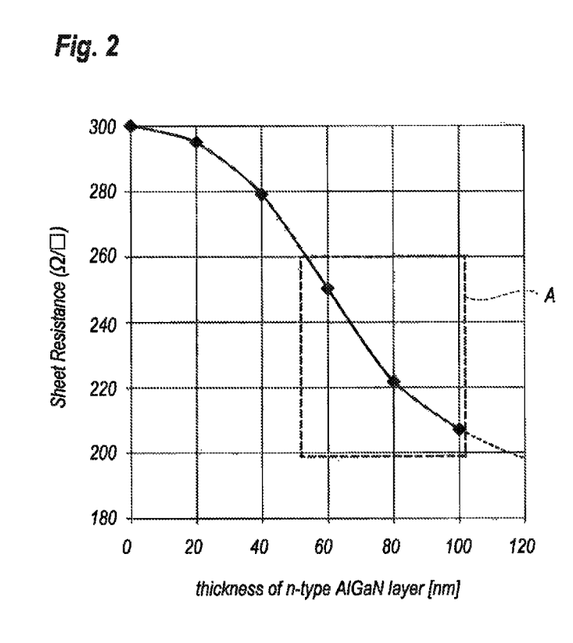
FIG. 2 shows a relation of sheet resistance against a thickness of n-type AlGaN layer.

The access resistance between the source and gate electrodes, 31 and 32, not only includes the contact resistance of the source electrode 31 against the n$^+$-type AlGaN layer 16 but depends on sheet resistance of the n$^+$-type AlGaN layer 16. FIG. 2 shows dependence of the sheet resistance of the n-type AlGaN layer 16 against a thickness thereof, where the n$^+$-type AlGaN layer has the aluminum composition of 25% in an average thereof and the silicon concentration [Si] of $3 \times 10^{18}$ cm$^{-3}$. As FIG. 2 clearly shows, the sheet resistance decreases as the increase of the thickness. When the thickness thereof becomes greater than 50 nm, the n$^+$-type AlGaN layer 16 may show the sheet resistance smaller than 265Ω/ $\square$, which is smaller than that practically appearing in conventional HEMTs.

An n-type AlGaN layer grown on a InAlN layer has a critical thickness depending on inner stresses determined by the aluminum composition of the n-type AlGaN layer. That is, the critical thickness of the AlGaN layer becomes greater as the aluminum composition becomes smaller. Accordingly, the aluminum composition greater than 20% severely restricts the thickness of the n$^+$-type AlGaN layer. In an example, the AlGaN layer in the thickness thereof is restricted to be thinner than 100 nm when the aluminum composition thereof is 20%.

The HEMT 1A of the present embodiment provides the n$^+$-type AlGaN layer 16 having the aluminum composition thereof at the region adjacent to the interface against the InAlN barrier layer 15 greater than the aluminum composition at another region of the top surface thereof to which the source electrode 31 is in contact. That is, the aluminum composition of the n$^+$-type AlGaN layer 16 decreases from the former region adjacent to the interface against the InAlN layer 15 to the latter region of the top surface thereof. Thus, in spite of a higher aluminum composition in the former region adjacent to the interface against the InAlN barrier layer 15, the n$^+$-type AlGaN layer 16 may have a moderate aluminum composition in an average, which enables to thicken the n$^+$-type AlGaN layer 16 to decrease the sheet resistance and resultantly to reduce the access resistance of the HEMT 1A.

The n-type AlGaN layer 16 of the embodiment has the aluminum composition at the region adjacent to the interface against the InAlN barrier layer 15, for instance greater than 20%, which may enhance various properties between an AlGaN and an InAlN, in particular, hardness in an etching by an acid enhances. Accordingly, the InAlN barrier layer 15 may operate as an etching sopping layer for etching the n-type AlGaN layer when the opening 16c is formed by etching the n$^+$-type AlGaN layer 16, which may also enhance the reproducibility of the threshold of the HEMT 1A.

Also, the n-type AlGaN layer 16 of the embodiment excludes indium (In), which means that growth temperatures for the semiconductor stack 12 may be kept high, for instance, higher than 800° C. but lower than 1100° C., during the growth thereof and increases doping density in the n$^+$-type AlGaN layer 16, where the HEMT 1A of the embodiment uses silicon (Si) as an n-type dopant therein. Thus, the n-type AlGaN layer 16 may decrease the sheet resistance thereof and the HEMT 1A may reduce the access resistance between the source electrode 31 and the gate electrode 32.

Also, the HEMT 1A of the embodiment does not uses the ion implantation for doping n-type impurities in the AlGaN layer 16, which means that the HEMT 1A may reduce the leak current between the source and gate electrodes, 31 and 32, and improve the pinch-off performance thereof. The HEMT 1A of the embodiment provides the InAlN barrier layer 15 with a thickness from 9 to 12 nm, which is relatively thinner compared with conventional HEMTs. Thus, the access resistance between the source and gate electrodes, 31 and 32, may be effectively reduced because a thinner InAlN barrier layer substantially transparent regarding the carrier transportation.

Second Embodiment

Figure 3:
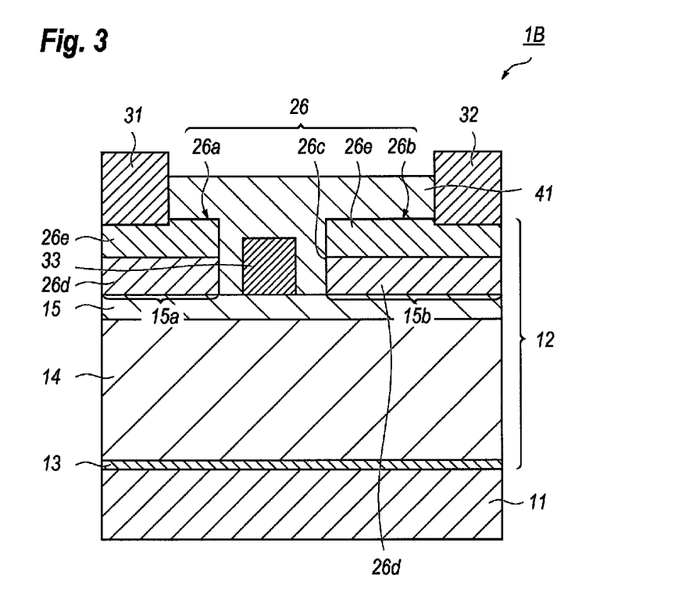
FIG. 3 schematically shows a cross section of another HEMT according to the second embodiment of the present application.

Next, a HEMT according to the second embodiment of the present application will be described. FIG. 3 schematically shows a cross section of a HEMT 1B of the second embodiment. The HEMT 1B provides an n-type AlGaN layer 26 substituting for the n$^+$-type AlGaN layer 16 of the first embodiment. Rest arrangements and structures of the HEMT 1B are same with those of the aforementioned HEMT 1A.

The n-type AlGaN layer 26, which is a heavily doped semiconductor layer grown on the InAlN barrier layer 15, includes a first region 26a and a second region 26b, where the former region 26a is formed on the first region 15a of the surface of the InAlN barrier layer 15, while, the second region 26b is formed on the second portion 15b of the InAlN barrier layer 15. An etching removes a region between the first and second regions, 26a and 26b, so as to form an opening 26c. Each of the first and second regions, 26a and 26b, of the AlGaN layer 26 includes a first layer 26d and a second layer 26e, where the first layer 26d is epitaxially grown on the InAlN barrier layer 15 to form the interface against the InAlN barrier layer 15, and the second layer 26e is grown on the first layer 26d to be in contact to the source electrode 31 and the drain electrode 32. The first and second layers, 26d and 26e, may be made of AlGaN heavily doped with silicon (Si). For instance, the first layer 26d and the second layer 26e have doping density of greater than $1 \times 10^{18}$ cm$^{-3}$ but less than $5 \times 10^{18}$ cm$^{-3}$.

Further specifically, the first layer 26d has the aluminum composition greater than that of the second layer 26e. The first layer 26d may have the aluminum composition of greater than 20% but less than 30%, typically 15%. The n-type AlGaN layer 26 has a total thickness of, which is a sum of thickness of first layer 26d and that of second layer 26e, greater than 50 nm but less than 100 nm similar to that of the first embodiment. The first layer 26d and the second layer 26e preferably have respective thicknesses greater than 40 nm.

The HEMT 1B of the second embodiment shows advantageous similar to those of the first embodiment. That is, the HEMT 1B provides the n-type AlGaN layer 26 on the InAlN barrier layer 15, which may suppress the lattice mismatching between the InAlN barrier layer 15 and the AlGaN layer 26 by adjusting the aluminum composition in the n-type AlGaN layer 26, and resultantly, the negative carriers induced in the surface between the InAlN barrier layer 15 and the n-type AlGaN layer 26 may be decreased. The n-type AlGaN layer 26, in particular, the first layer 26d in contact to the InAlN barrier layer 15 has the aluminum composition of greater than 20%, which may decrease the carries induced in the interface against a conventional InAlN barrier layer 15 having the indium composition of 17%. Thus, the HEMT 1B of the present embodiment shows lowered contact resistance against the source electrode 31 and the drain electrode 32.

The n-type AlGaN layer 26 of the HEMT 1B of the present embodiment, similar to the HEMT 1A of the aforementioned embodiment, has the aluminum composition at the interface against the InAlN barrier layer 15, namely, the aluminum composition of the first layer 26d, greater than the aluminum composition at the top surface thereof, namely, that of the second layer 26e. Thus, the HEMT 1B may decrease an overall aluminum composition of the n-type AlGaN layer 26 as maintaining the aluminum composition at the interface against the InAlN barrier layer 15, which enables to increase the thickness of the n-type AlGaN layer 26 and to reduce the sheet resistance thereof. Thus, the access resistance between the source electrode 31 and the gate electrode 33 may be reduced.

Next, results of the HEMTs, 1A and 1B, of the present invention will be compared with a HEMT that provides a heavily doped n-type GaN layer on the InAlN barrier layer.

Preparation of First Embodiment

The first example of a HEMT has a structure of the first example 1A shown in FIG. 1, and may be formed by processes of:

(1) Epitaxially growing an aluminum nitride (AlN) buffer layer 13 by a thickness of 30 nm on a silicon carbide (SiC) substrate by the MOCVD technique using tri-methyl-aluminum (TMA) and ammonia ($NH_3$) as source gasses for aluminum (Al) and nitrogen (N), respectively, under a growth temperature of 1080° C. and a growth pressure of 13.3 kPa.

(2) Epitaxially growing a gallium nitride (GaN) channel layer 14 by a thickness of 600 nm on the AlN buffer layer 13 using tri-methyl-gallium (TMG) and $NH_3$ for source gasses of gallium (Ga) and N, respectively, under a growth temperature of 1080° C. and a growth pressure of 13.3 kPa. Flow rates of the TMG and $NH_3$ were 120 μmol/min and 0.5 mol/min, respectively.

(3) Epitaxially growing an indium-aluminum nitride (InAlN) barrier layer 15 on the GaN channel layer 14 by a thickness of 10 nm using tri-methyl-indium (TMI), TMA, and NH3 as source gasses for In, Al, and N, respectively, under a growth temperature of 800° C. and a growth pressure of 13.3 kPa. The indium composition in the InAlN barrier layer 15 was 17%, where a lattice constant of the InAlN barrier layer 15 matched with a lattice constant of the GaN channel layer.

(4) Epitaxially growing an aluminum gallium nitride (AlGaN) layer 16 on the InAlN barrier layer 15 by a thickness of 50 nm using TMA, TMG, and $NH_3$ as source materials for Al, Ga, and N, respectively, under a growth temperature of 900° C. and a growth pressure of 13.3 kPa as supplying silicon (Si) as an n-type dopant. The grown AlGaN layer 16 had the doping density of $3\times10^{18}$ cm$^{-3}$, and the Al compositions of 30% at the interface against InAlN barrier layer 15 but 15% at the surface of the AlGaN layer 16. After the growth of the AlGaN layer 16, the opening 16c was formed by partially etching the AlGaN layer 16 so as to expose the surface of the InAlN barrier layer 15.

(5) Forming the source electrode 31 and the drain electrode 32 on the n-type AlGaN layer 16, and the gate electrode 33 made of stacked metals of titanium Ti and aluminum Al is formed on the InAlN barrier layer 16 exposed within the opening 16c of the AlGaN layer 16. Photolithography and a subsequent metal lift-off technique formed interconnections to the source, drain, and gate electrodes, 31 to 33, and the protection film 41 made of silicon nitride (SiN) covered the source, drain, and gate electrodes, 31 to 33. Thus, the HEMT 1A was completed. The HEMT 1A had a gate length (Lg) of 0.2 μm, and a space between the source and drain electrodes, 31 and 32, of 3.0 μm including the opening 16c with a width of 0.6 μm.

Preparation of Second Embodiment

Another HEMT 1B according to the second embodiment was formed as follows:

(1) Growing on the SiC substrate the buffer layer 13, the GaN channel layer 14, and the InAlN barrier layer 15 sequentially by the Metal-Organized Chemical Vapor Deposition (MOCVD) technique, which was similar to that of the first embodiment describe above. Then, the n-type AlGaN layer 26 that includes the first layer 26d and the second layer 26e was grown on the InAlN barrier layer 16 using TMA, TMG, and NH3 as source gasses for Al, Ga, and N, respectively, under the growth temperature of 900° C. and the growth pressure of 13.3 kPa by a thickness of 40 nm, where the first layer 26d was grown as doping silicon (Si) as the n-type impurities by density of $3\times10^{18}$ cm$^{-3}$, and had the aluminum (Al) composition of 25%. Then, the second layer 25e was epitaxially grown on the first layer 26d as supplying TMA, TMG, and $NH_3$ as source gasses for Al, Ga, and N under the growth temperature of 900° C. and the growth pressure of 13.3 kPa as doping silicon (Si) for the n-type impurity. The second layer 26e had a thickness of 40 nm, the impurity density of $3\times10^{18}$ cm$^{-3}$, and the aluminum (A)l composition of 15%. After the growth of the second layer 26e, the opening 26c was formed by partially removing the second layer 26e also the first layer 26d by dry-etching the first and second layers, 26d and 26e, to expose the surface of the InAlN barrier layer 15.

(2) Forming the source and drain electrodes, 31 and 32, on the n-type AlGaN layer 26, and the gate electrode 33 on the InAlN barrier layer 16 exposed within the opening 26c by processes similar to those of the first embodiment. After forming the interconnections coupling the source, drain and gate electrodes, 31 to 33, the protection film 41 made of silicon nitride (SiN) fully covers the gate electrode 33 and the exposed surface of the InAlN barrier layer 15 within the opening 26c, the HEMT 1B was completed. The HEMT 1B had the gate length of 0.2 μm, the space between the source and drain electrodes, 31 and 32, of 3.0 μm, where the space includes the width of the opening 26c, which is 0.6 μm.

Preparation of First Comparable Example

A HEMT according to one of examples comparable to the HEMT, 1A or 1B, of the present invention was formed as follows:

(1) Growing the buffer layer 13, the GaN channel layer, and the AlGaN barrier layer sequentially on the SiC substrate by the MOCVD technique; then, a heavily doped GaN layer was grown on the InAlN barrier layer 15 by a thickness of 50 nm as doping n-type impurities under the growth temperature of 900° C. and the growth pressure of 13.3 kPa. The n-type impurities were silicon (Si) and the doping density was $3 \times 10^{18}$ cm$^{-3}$. After the growth of the n-type GaN layer, the dry-etching formed the opening within which the InAlN barrier layer 15 was exposed.

(2) Forming the source and drain electrodes, 31 and 32, on the n-type GaN layer, and the gate electrode 33 on the exposed InAlN barrier layer 15. Then, forming the interconnections each drawn out from the source, drain, and gate electrodes, 31 to 33, the protection film 41 made of silicon nitride (SiN) covered the electrodes, 31 to 33, the n-type GaN layer, and the exposed InAlN barrier layer 15. Thus, the HEMT of the comparable example was completed. The HEMT thus formed had the gate length Lg of 0.2 μm, the space between the source and drain electrodes, 31 and 32, of 3.0 μm and the width of the opening of 0.6 μm; where those dimensions were same with those of the HEMTs of the first and second examples described above.

Preparation of Second Comparable Example

A HEMT according to the second comparable example was prepared as follows:

(1) Similar to those of the aforementioned examples, sequentially growing the buffer layer 13, the GaN channel layer 14, and the InAlN barrier layer 15 on the SiC by the MOCVD technique.

(2) Then, the source, drain, and gate electrodes, 31 to 33, were formed on the InAlN barrier layer. A feature of the HEMT of the second comparable example is that the source and drain electrodes were formed directly on the InAlN barrier layer 15; that is, the HEMT had no layers to reduce the sheet resistance of the barrier layer 15. Then, forming the interconnections each drawn out from the source, drain, and gate electrodes, 31 to 33, the protection film 41 made of silicon nitride (SiN) covered the electrodes, 31 to 33, the n-type GaN layer, and the InAlN barrier layer 15. Thus, the HEMT of the second comparable example was completed. The HEMT thus formed had the gate length Lg of 0.2 μm, the space between the source and drain electrodes, 31 and 32, of 3.0 μm; where those dimensions were same with those of the HEMTs of the first and second examples described above.

Evaluation Device Performance

The evaluation of the respective HEMTs thus prepared were carried out as supplying 10 V to the drain electrode and setting the drain currents to be 200 mA/mm by adjusting the gate biases. Under such bias conditions, the HEMTs were measured in high frequency performances thereof.

The HEMT 1B according to the second embodiment of the present invention showed the cut-off frequency of 115 GHz and the gain of 8.5 dB at 60 GHz. Further, the HEMT 1A of the first embodiment, which had the n-type AlGaN layer on the InAlN barrier layer 15 but the aluminum composition at the interface against the InAlN barrier layer 15 was relatively smaller compared with the HEMT 1B of the second embodiment, showed the cut-off frequency of 90 GHz and the gain of 7.0 dB at 60 GHz.

Table below summarizes the evaluation of the two HEMTs, 1A and 1B, of the present invention and two HEMTs of the comparable examples. As shown in Table, the sheet resistance was 300Ω/□ that was largest for the second comparable example, which had no heavily doped layer on the InAlN barrier layer 15, but other HEMTs, 1A, 1B and the first comparable example reduced the sheet resistance thereof to 200Ω/□. However, in the HEMT of the first comparable example, the cut-off frequency thereof was decreased to 60 GHz because of the carries induced in the interface between the GaN layer and the InAlN barrier layer 15. In the HEMTs, 1A and 1B, of the present embodiment, the reduction of the sheet resistance derived from the heavily doped AlGaN layers, 16 and 26, directly appear in the decrease of the contact resistance and the access resistance thereof and resultantly the increase of the cut-off frequency.

| | first example | second example | first embodiment | second embodiment |
|---|---|---|---|---|
| sheet resistance (Ω/□) | 200 | 300 | 200 | 200 |
| contact resistance (Ω · mm) | 0.41 | 0.21 | 0.16 | 0.10 |
| access resistance (Ω · mm) | 0.51 | 0.26 | 0.26 | 0.20 |
| cut-off frequency (GHz) | 60 | 70 | 90 | 115 |

Specifically, the HEMT 1A of the first embodiment showed the cut-off frequency of 90 GHz, which is higher than that of the first comparable example, because the access resistance decreased to 0.26 Ω·mm from 0.51 Ω·mm. Moreover, the HEMT 1B of the second embodiment showed a further enhanced cut-off frequency of 115 GHz, which was due to the reduction of the contact resistance from 0.16 Ω·mm to 0.10 Ω·mm; because the n-type AlGaN layer of the second embodiment 1B had the aluminum composition at the interface against the source electrode 31 relatively smaller than that of the first embodiment.

While there has been illustrated and described what are presently considered to be exemplary embodiment of the present invention, it will be understood by those skilled in the art that various other modifications may be made, and equivalents may be substituted, without departing from the true scope of the invention. For instance, the second embodiment provides the n-type AlGaN layer having two layers distinguishable from the aluminum (Al) composition. However, the n-type AlGaN layer may have three or more layers distinguishable from the aluminum (Al) composition. In such a case, the layer in contact to the InAlN barrier layer has the higher aluminum composition, while another layer in contact to the source and drain electrodes may have the lowest aluminum (Al) composition. Therefore, it is intended that the present invention not be limited to the particular embodiments disclosed, but that the invention include all embodiments falling within the scope of the appended claims.

I claim:

1. A nitride semiconductor device, comprising:
   a channel layer made of gallium nitride (GaN);
   a barrier layer made of indium aluminum nitride (InAlN) that is formed on the channel layer;
   an n-type layer made of aluminum gallium nitride (AlGaN) that is formed on the barrier layer, the n-type layer being doped with n-type impurities, the n-type layer having an aluminum composition greater than 20% at an interface against the barrier layer, the aluminum composition of the n-type layer at the interface being greater than the aluminum composition at a surface opposite to the interface; and
   a source electrode, a drain electrode, and a gate electrode, the source electrode and the drain electrode being provided on the n-type layer, and the gate electrode being in direct contact with the barrier layer.

2. The nitride semiconductor device of claim 1, wherein the n-type layer has a thickness greater than 50 nm but smaller than 100 nm.

3. The nitride semiconductor device of claim 2, wherein the n-type layer includes a first layer including the interface and a second layer including the surface, the first layer having the aluminum composition greater than 20% and greater than an aluminum composition of the second layer.

4. The nitride semiconductor device of claim 3, wherein the first layer and the second layer have respective thicknesses greater than 40 nm.

5. The nitride semiconductor device of claim 1, wherein the aluminum composition of the n-type layer monotonically decreases from the interface to the surface.

6. The nitride semiconductor device of claim 1, wherein the barrier layer has a thickness greater than 9 nm but less than 12 nm.

7. The nitride semiconductor device of claim 1, wherein the n-type layer has an opening that exposes a surface of the barrier layer, the gate electrode being formed within the opening.

8. The nitride semiconductor device of claim 7, further including an insulating film that covers the barrier layer exposed within the opening and the gate electrode provided within the opening.

9. The nitride semiconductor device of claim 1, wherein the barrier layer has an indium composition greater than 15% but smaller than 20%.

10. The nitride semiconductor device of claim 9, wherein the barrier layer has a lattice constant substantially matching with a lattice constant of the channel layer.

11. The nitride semiconductor device of claim 9, wherein the n-type layer has a lattice constant miss-matched with a lattice constant of the barrier layer.

12. The nitride semiconductor device of claim 1, wherein the n-type layer has a doping density of the n-type impurities from $1 \times 10^{18}$ cm$^{-3}$ to $5 \times 10^{18}$ cm$^{-3}$.

13. The nitride semiconductor device of claim 12, wherein the n-type impurities are silicon (Si).

* * * * *